(12) United States Patent
Zhao et al.

(10) Patent No.: US 12,158,481 B2
(45) Date of Patent: Dec. 3, 2024

(54) PROBE CARD FOR TESTING POWER DEVICES UNDER HIGH TEMPERATURE AND HIGH VOLTAGE

(71) Applicant: MAXONE SEMICONDUCTOR CO., LTD., Jiangsu (CN)

(72) Inventors: Liangyu Zhao, Suzhou (CN); Ailin Wang, Suzhou (CN); Xinggang Wang, Suzhou (CN); Ming Zhou, Suzhou (CN)

(73) Assignee: MAXONE SEMICONDUCTOR (SUZHOU) CO., LTD., Suzhou (CN)

( * ) Notice: Subject to any disclaimer, the term of this patent is extended or adjusted under 35 U.S.C. 154(b) by 151 days.

(21) Appl. No.: 18/014,235

(22) PCT Filed: Jul. 1, 2021

(86) PCT No.: PCT/CN2021/103983
§ 371 (c)(1),
(2) Date: Jan. 3, 2023

(87) PCT Pub. No.: WO2022/002196
PCT Pub. Date: Jan. 6, 2022

(65) Prior Publication Data
US 2023/0258690 A1    Aug. 17, 2023

(30) Foreign Application Priority Data

Jul. 1, 2020   (CN) .......................... 202010621063.4

(51) Int. Cl.
*G01R 1/067* (2006.01)
*G01R 1/073* (2006.01)
(Continued)

(52) U.S. Cl.
CPC ...... *G01R 1/06777* (2013.01); *G01R 1/07314* (2013.01); *G01R 31/2601* (2013.01); *G01R 35/005* (2013.01)

(58) Field of Classification Search
CPC ............ G01R 31/2874; G01R 1/06777; G01R 1/2879; G01R 1/07314
See application file for complete search history.

(56) References Cited

U.S. PATENT DOCUMENTS

| 2010/0184306 | A1* | 7/2010 | Hironaka | G01R 1/0458 439/55 |
| 2011/0121847 | A1* | 5/2011 | Umemura | G01R 1/0735 324/754.11 |
| 2017/0299629 | A1* | 10/2017 | Tsai | G01R 1/06777 |

FOREIGN PATENT DOCUMENTS

| CN | 102103153 A | 6/2011 |
| CN | 107305218 A | 10/2017 |

(Continued)

OTHER PUBLICATIONS

Sep. 28, 2021 International Search Report issued in International Patent Application No. PCT/CN2021/103983.

(Continued)

*Primary Examiner* — Noam Reisner
(74) *Attorney, Agent, or Firm* — Oliff PLC

(57) ABSTRACT

A probe card for testing power devices under high temperature and high voltage. The probe card includes air inlet system, PCB board, switching layer, guide plate and probe from top to bottom; the bottom of air inlet system includes plurality of lower air outlets and side air outlets, the PCB board includes a first through-hole with same position, shape and quantity as the lower air outlet, the switching layer includes a second through-hole with same position, shape and quantity as the lower air outlet, the guide plate includes a third through-hole with same position, shape and quantity (Continued)

as the lower air outlet. The lower air outlet, the first through-hole, the second through-hole and the third through-hole are coaxially arranged. The high-temperature and high-pressure gas ejected from the lower air outlet is blown between the guide plate and the tested wafer after successively passing through the first, second, and third through-holes.

4 Claims, 5 Drawing Sheets

(51) Int. Cl.
 *G01R 31/26* (2020.01)
 *G01R 35/00* (2006.01)

(56) References Cited

FOREIGN PATENT DOCUMENTS

| | | |
|---|---|---|
| CN | 209707128 U | 11/2019 |
| CN | 210376447 U | 4/2020 |
| CN | 111624373 A | 9/2020 |
| CN | 111624374 A | 9/2020 |
| JP | 2004-264168 A | 9/2004 |

OTHER PUBLICATIONS

Sep. 28, 2021 Written Opinion issued in International Patent Application No. PCT/CN2021/103983.

* cited by examiner

PROBE CARD FOR TESTING POWER DEVICES UNDER HIGH TEMPERATURE AND HIGH VOLTAGE

TECHNICAL FIELD

The invention relates to a probe card for testing power devices under high temperature and high voltage and its key structure, belonging to the technical field of semiconductor device testing.

BACKGROUND OF INVENTION

With the continuous development of MEMS technology and semiconductor technology, the output of miniaturized high-power devices is increasing year by year. Many devices have to work in high voltage and high temperature environment. It is necessary to test the performance with a probe card to ensure that these devices can work normally in such a harsh environment.

An important indicator of power device testing is the breakdown voltage, which can be as high as thousands of volts. When testing at such a high voltage, abnormal discharge may be generated between the probes of the probe card, which can damage the testing equipment and the tested wafer instantaneously.

Another important indicator of the power device testing is the operating temperature. Generally speaking, the test chips are required to work normally between −40° C. and 125° C., while some chips in the automotive field are required to work normally in the environment of more than 180° C., so we need to test their performance in the environment of more than 180° C. Due to the difference of thermal expansion coefficient between the components of the probe card, the temperature change from room temperature to more than 180° C.; will cause the warping deformation of the probe card and the position drift of the probe, which not only reduces the testing effect and efficiency, but also even causes problems such as test failure and probe damage in serious cases.

It can be seen that how to suppress the abnormal discharge between probes in the high voltage environment, and how to suppress the warping deformation of the probe card and the position drift of the probe in the high-temperature environment are the key technical problems of probe card technology that need to be solved urgently for power device testing. However, there is no probe card that can solve these two technical problems at the same time at present.

DISCLOSURE OF THE INVENTION

In view of the above problems, the invention discloses a probe card for testing power devices under high temperature and high voltage and its key structure, which can not only suppress abnormal discharge between probes under high voltage environment, but also suppress the warping deformation of probe card and the position drift of probe under high-temperature environment.

The purpose of the invention is achieved in this way:

A probe card for testing power devices under high temperature and high voltage is sequentially provided with an air inlet system, a PCB board, an switching layer, a guide plate and a probe from top to bottom; the bottom of the air inlet system is provided with a plurality of lower air outlets and side air outlets, the PCB board is provided with a first through-hole with the same position, shape and quantity as the lower air outlet, the switching layer is provided with a second through-hole with the same position, shape and quantity as the lower air outlet, the guide plate is provided with a third through-hole with the same position, shape and quantity as the lower air outlet. The lower air outlet, the first through-hole, the second through-hole and the third through-hole are coaxially arranged. The high-temperature and high-pressure gas ejected from the lower air outlet is blown between the guide plate and the tested wafer after successively passing through the first through-hole, the second through-hole and the third through-hole;

The air inlet system also comprises a pressure-relief hole, and the pressure-relief hole is tapped with threads on the inner wall, and it's screwed with an adjusting part, and the adjusting part includes a contact end with a T-shaped section and a through-hole in the middle, an annular magnet and an fixed end of the upper magnet, and the wide side wall of the contact end is sleeved with threads for screwing on the inner wall of the pressure-relief hole, the narrow part is provided with an annular magnet, and the narrow side wall is sleeved with threads, and the inner wall of the fixed end of the upper magnet is tapped with threads for screwing on the narrow side wall of the contact end, and the bottom of the wide part of the contact end and the upper part of the fixed end of the upper magnet fix the annular magnet; the pressure-relief hole is also screwed with a valve part on the inner wall, and the valve part comprises a connector with an inverted T-shaped section and a stepped through-hole, which is narrow at the top and wide at the bottom, and the narrow side wall of the connector is sleeved with threads for screwing on the inner wall of the pressure-relief hole, and a circular magnet is placed at the wide part of the stepped through-hole, and the circular magnet is stuck with a sealing gasket on the top and equipped with a notch on the side wall and a notch at the bottom, and the notch on the side wall is connected with the notch at the bottom, and the wide inner wall of the stepped through-hole is tapped with threads, and is screwed with a shielding ring with a through-hole in the middle, and the circular magnet can move up and down above the shielding ring under the attraction of the annular magnet and the push of the compressed air;

The function of each structure is as follows:

The thickness of the edge of the guide plate is greater than that of the central area;

The air inlet system is used to provide high-temperature and high-pressure gas and normal temperature and high-pressure gas, the lower air outlet is used to inject high-temperature and high-pressure gas to the probe, and the side air outlet is used to provide normal temperature and high-pressure gas to the PCB board;

The PCB board is used for connecting the testing machine and the signal wiring;

The switching layer is the medium between the probe and the PCB board, which is used to realize the signal distance conversion;

The guide plate is used for accommodating the probe;

The probe is used for connecting the tested wafer.

The probe card for testing power devices under high temperature and high voltage, wherein the cross-sectional area of the side air outlet is gradually increased in the direction of constant temperature air flow, and the outer end of the side air outlet is a rectangle with a width greater than the height; under the outer end of the side air outlet, the rotating shaft is connected with a baffle, and the edge of the other side of the baffle is equipped with a pull rope and the pull rope passes through the upper part of the side air outlet, and the upper part of the side air outlet is also provided with a fixed end of the pull rope. And the fixed end of the pull rope comprises a frame, a fixed plate arranged in the frame and capable of moving up and down along the frame, a pressure spring located below the fixed plate and above the bottom of the frame, and a switch located above the frame, and the switch is connected to the fixed plate through a bracket passing through the frame. And the pull rope passes through the frame from the top of the fixed plate, and squeezed between the fixed plate and the frame under the action of the pressure spring. When the adjustment is needed, press the switch to make the fixed plate move downward to adjust the pull rope and release the switch after the position is adjusted.

The probe card for testing power devices under high temperature and high voltage, wherein the air inlet system also comprises a dual air inlet device, and according to the air flow direction, the dual air inlet device comprises an air pump, a first three-way valve, a high-temperature and high-pressure tank connecting the first outlet of the first three-way valve, and a normal temperature and high-pressure tank connecting the second outlet of the first three-way valve. The high-temperature and high-pressure tank is equipped with a resistance wire, a temperature sensor and a first manometer and the normal temperature and high-pressure tank is equipped with a second manometer. The high-temperature and high-pressure tank has two outlets, and the first outlet is connected to a lower air outlet through the first valve, and the second outlet is connected to a second three-way valve, and the second three-way valve is also connected to the outlet of the normal temperature and high-pressure tank and the second valve respectively, and the second valve is connected to the side air outlet.

The probe card for testing power devices under high temperature and high voltage, wherein the thickness of the edge of the guide plate is greater than the thickness of the central area, which is realized by the following technical features: the air bags are arranged around the lower part of the guide plate.

A probe card has a side air outlet, wherein the cross-sectional area is gradually increased in the direction of constant temperature air flow, and the outer end of the side air outlet is a rectangle with a width greater than the height; under the outer end of the side air outlet, the rotating shaft is connected with a baffle, and the edge of the other side of the baffle is equipped with a pull rope and the pull rope passes through the upper part of the side air outlet, and the upper part of the side air outlet is also provided with a fixed end of the pull rope. And the fixed end of the pull rope comprises a frame, a fixed plate arranged in the frame and capable of moving up and down along the frame, a pressure spring located below the fixed plate and above the bottom of the frame, and a switch located above the frame, and the switch is connected to the fixed plate through a bracket passing through the frame. And the pull rope passes through the frame from the top of the fixed plate, and squeezed between the fixed plate and the frame under the action of the pressure spring. When the adjustment is needed, press the switch to make the fixed plate move downward to adjust the pull rope and release the switch after the position is adjusted.

A probe card has a dual air inlet device, wherein according to the air flow direction, it comprises an air pump, a first three-way valve, a high-temperature and high-pressure tank connecting the first outlet of the first three-way valve, and a normal temperature and high-pressure tank connecting the second outlet of the first three-way valve. The high-temperature and high-pressure tank is equipped with a resistance wire, a temperature sensor and a first manometer and the normal temperature and high-pressure tank is equipped with a second manometer. The high-temperature and high-pressure tank has two outlets, and the first outlet is connected to a lower air outlet through the first valve, and the second outlet is connected to a second three-way valve, and the second three-way valve is also connected to the outlet of the normal temperature and high-pressure tank and the second valve respectively, and the second valve is connected to the side air outlet.

Beneficial Effects:

First, the invention discloses a probe card for testing power devices under high temperature and high voltage. The probe card is provided with an air inlet system for providing high-temperature and high-pressure gas and normal temperature and high-pressure gas, and the high-temperature and high-pressure gas is supplied to the probe position, and the normal temperature and high-pressure gas is supplied to the PCB board position; at the probe position, the breakdown voltage of the uniform electric field increases with the increase of the pressure, so the high-temperature and high-pressure gas can improve the breakdown voltage of the probe, avoid abnormal discharge between the probes, and protect the test equipment and the tested wafer; at the same time, high-temperature and high-pressure gas can increase the temperature of probe and tested wafer to achieve high-temperature testing; at the PCB board position, due to the supply of normal temperature and high-pressure gas, the temperature of the entire probe card, except for the probe, is always kept at normal temperature, which effectively avoids the thermal expansion coefficient difference between the components of the probe card, the warping deformation of the probe card and the position drift of the probe when testing at different temperatures, and effectively improves the testing effect and efficiency.

Second, the invention discloses the probe card for testing power devices under high temperature and high voltage, which can not only suppress abnormal discharge between probes under high voltage environment, but also suppress the warping deformation of probe card and the position drift of probe under high-temperature environment, and has the beneficial effect of one machine with multiple functions.

Third, the invention also discloses a probe card having side air outlet structure. Under the structure, the angle of the baffle can be changed by pulling the pull rope, and then the injection angle and pressure of the normal temperature and high-pressure gas can be adjusted at the same time, so that the side air outlet has the adjustment function.

Fourth, the invention also discloses a probe card carrying a dual air inlet device, which is specially designed for the probe card used for testing power devices under high-temperature and high voltage, and is used to provide high-temperature and high-pressure gas and normal temperature and high-pressure gas at the same time.

Fifth, the invention also discloses a magnetic pressure relief structure, which can ensure that the pressure at the probe is the required pressure, and will automatically release pressure when the pressure exceeds the threshold value, free from uncontrollable problems due to excessive pressure.

Sixth, the invention also provides an installation method and a calibration method for the magnetic pressure relief structure, which can realize the adjustment of the pressure at the probe during the test.

In the figures: 1 air inlet system, 1-1 lower air outlet, 1-2 side air outlet, 1-2-1 baffle, 1-2-2 pull rope, 1-2-3 fixed end of pull rope, 1-2-3-1 frame, 1-2-3-2 fixed plate, 1-2-3-3 pressure spring, 1-2-3-4 switch, 1-2-3-5 bracket, 1-3 pressure relief hole, 1-4 valve part, 1-4-1 connector, 1-4-2 circular magnet, 1-4-3 sealing gasket, 1-4-4 shielding ring, 1-5 adjusting part, 1-5-1 contact end, 1-5-2 annular magnet, 1-5-3 fixed end of upper magnet, 1-7 double air inlet device, 1-7-1 air pump, 1-7-2 first three-way valve, 1-7-3 high-temperature and high-pressure tank, 1-7-3-1 resistance wire, 1-7-3-2 temperature sensor, 1-7-3-3 first manometer, 1-7-4 normal temperature and high-pressure tank, 1-7-4-1 second manometer, 1-7-5 first valve, 1-7-6 second three-way valve, 1-7-7 second valve, 2 PCB board, 2-1 first through-hole, 3 switching layer, 3-1 second through-hole, 4 guide plate, 4-1 third through-hole, 4-2 air bag, 5 probe, 6 tested wafer.

SPECIFIC EMBODIMENT

The specific embodiments of the invention are further described in detail below with reference to the figures.

Embodiment 1

The following is a specific embodiment of a probe card for testing power devices under high temperature and high voltage.

Figure 1:
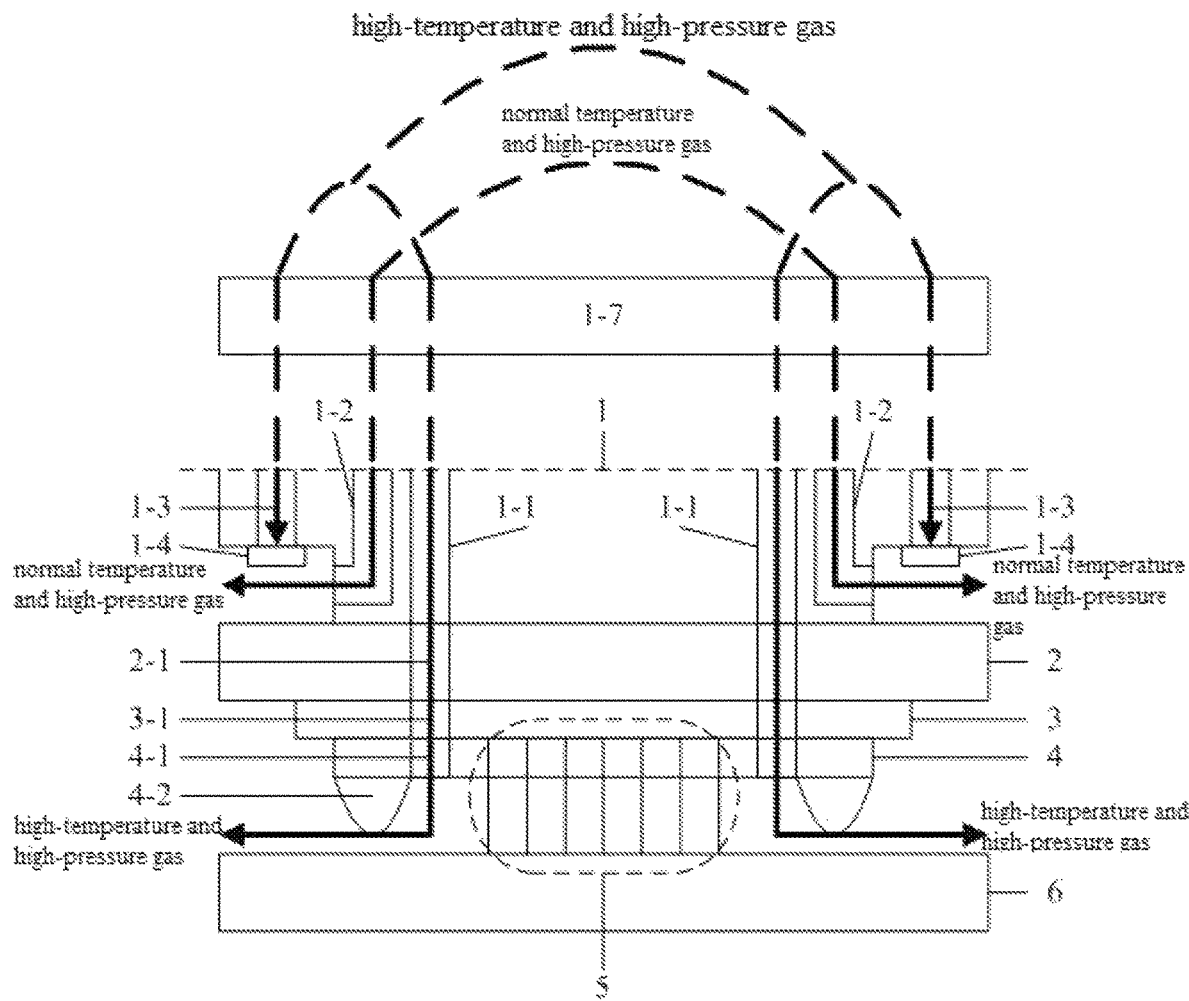
FIG. 1 is a schematic view of a probe card for testing power devices under high temperature and high voltage.
Figure 2:
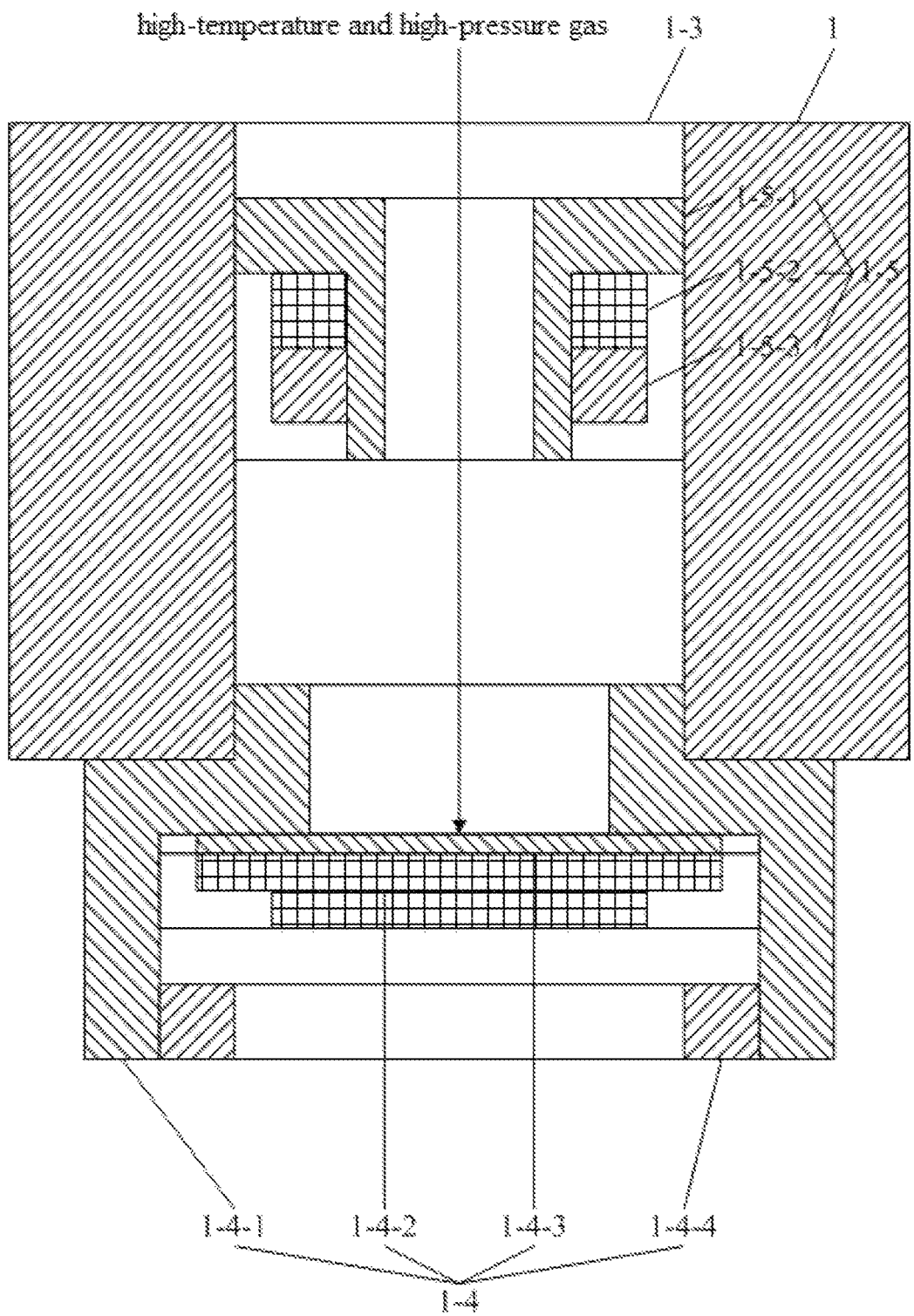
FIG. 2 is the schematic view of the position relationship between the relevant components when the pressure relief hole is not working.
Figure 3:
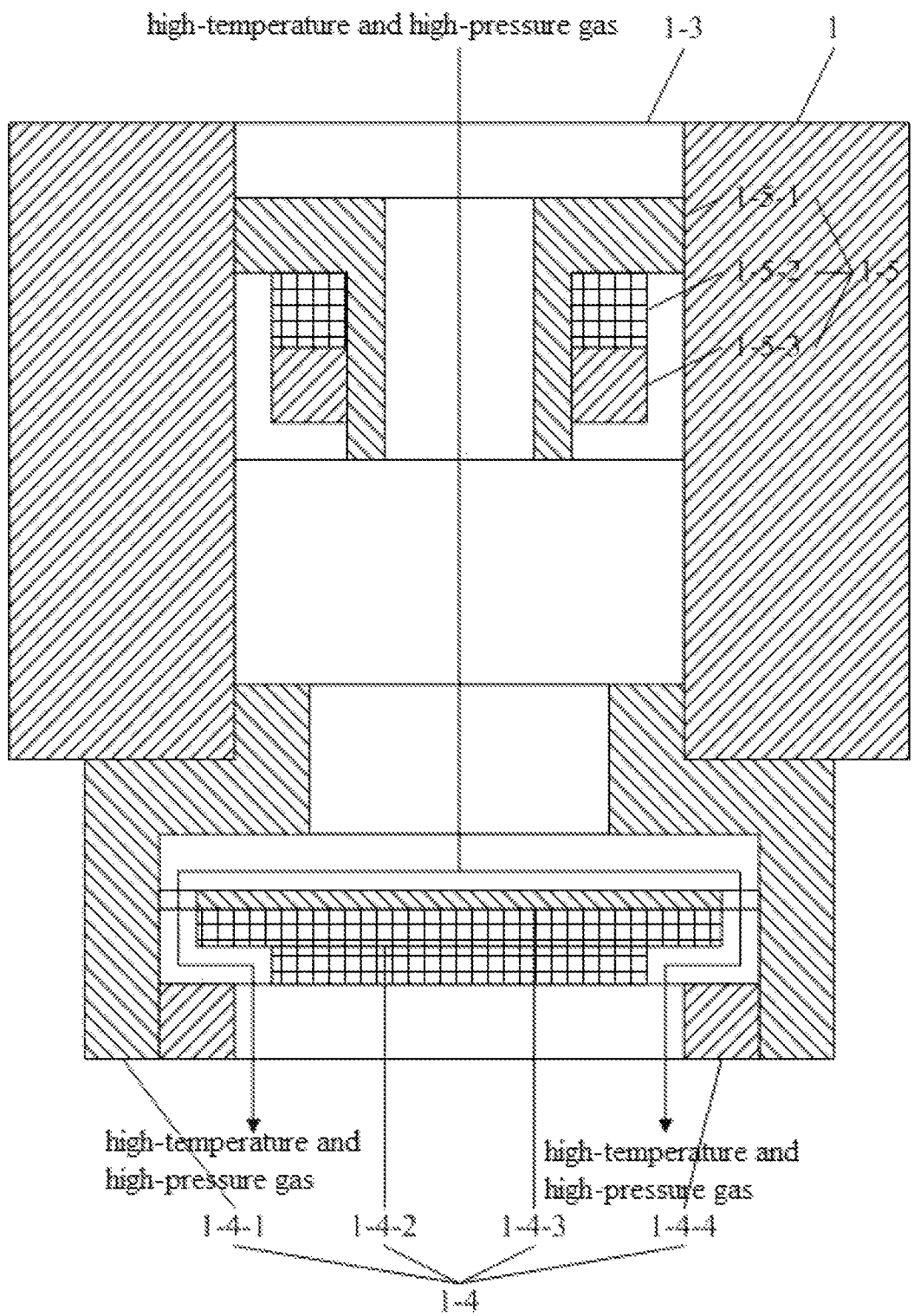
FIG. 3 is the schematic view of the position relationship between the relevant components when the pressure relief hole is working.

A probe card for testing power devices under high temperature and high voltage of the invention as shown in FIG. 1 wherein the probe card is sequentially provided with an air inlet system 1, a PCB board 2, an switching layer 3, a guide plate 4 and a probe 5 from top to bottom; the bottom of the air inlet system 1 is provided with a plurality of lower air outlets 1-1 and side air outlets 1-2, the PCB board 2 is provided with a first through-hole 2-1 with the same position, shape and quantity as the lower air outlet 1-1, the switching layer 3 is provided with a second through-hole 3-1 with the same position, shape and quantity as the lower air outlet 1-1, the guide plate 4 is provided with a third through-hole 4-1 with the same position, shape and quantity as the lower air outlet 1-1. The lower air outlet 1-1, the first through-hole 2-1, the second through-hole 3-1 and the third through-hole 4-1 are coaxially arranged. The high-temperature and high-pressure gas ejected from the lower air outlet 1-1 is blown between the guide plate 4 and the tested wafer 6 after successively passing through the first through-hole 2-1, the second through-hole 3-1 and the third through-hole 4-1;

The air inlet system 1 also comprises a pressure-relief hole 1-3, and the pressure-relief hole 1-3 is tapped with threads on the inner wall, and it's screwed with an adjusting part 1-5, and the adjusting part 1-5 comprises a contact end 1-5-1 with a T-shaped section and a through-hole in the middle, an annular magnet 1-5-2 and an fixed end of the upper magnet 1-5-3, and the wide side wall of the contact end 1-5-1 is sleeved with threads for screwing on the inner wall of the pressure-relief hole 1-3, the narrow part is provided with an annular magnet 1-5-2, and the narrow side wall is sleeved with threads, and the inner wall of the fixed end of the upper magnet 1-5-3 is tapped with threads for screwing on the narrow side wall of the contact end 1-5-1, and the bottom of the wide part of the contact end 1-5-1 and the upper part of the fixed end of the upper magnet 1-5-3 fix the annular magnet 1-5-2; the pressure-relief hole 1-3 is also screwed with a valve part 1-4-1 on the inner wall, and the valve part 1-4-1 comprises a connector 1-4-1 with an inverted T-shaped section and a stepped through-hole, which is narrow at the top and wide at the bottom, and the narrow side wall of the connector 1-4-1 is sleeved with threads for screwing on the inner wall of the pressure-relief hole 1-3, and a circular magnet 1-4-2 is placed at the wide part of the stepped through-hole, and the circular magnet 1-4-2 is stuck with a sealing gasket 1-4-3 on the top and equipped with a notch on the side wall and a notch at the bottom, and the notch on the side wall is connected with the notch at the bottom, and the wide inner wall of the stepped through-hole is tapped with threads, and is screwed with a shielding ring 1-4-4 with a through-hole in the middle, and the circular magnet 1-4-2 can move up and down above the shielding ring 1-4-4 under the attraction of the annular magnet 1-5-2 and the push of the compressed air;

The connection relationship between pressure relief hole 1-3, valve part 1-4 and adjusting part 1-5 is shown in FIG. 2 and FIG. 3, where FIG. 2 is the schematic view of the position relationship between the relevant components when the pressure relief hole is not working and FIG. 3 is the schematic view of the position relationship between the relevant components when the pressure relief hole is working.

The function of each structure of the probe card is as follows:

The thickness of the edge of the guide plate 4 is greater than that of the central area;

The air inlet system 1 is used to provide high-temperature and high-pressure gas and normal temperature and high-pressure gas, the lower air outlet 1-1 is used to inject high-temperature and high-pressure gas to the probe 5, and the side air outlet 1-2 is used to provide normal temperature and high-pressure gas to the PCB board 2;

The PCB board 2 is used for connecting the testing machine and the signal wiring;

The switching layer 3 is the medium between the probe and the PCB board 2, which is used to realize the signal distance conversion;

The guide plate 4 is used for accommodating the probe 5;

The probe 5 is used for connecting the tested wafer 6.

Embodiment 2

The following is a specific embodiment of a probe card for testing power devices under high-temperature and high voltage.

Figure 4:
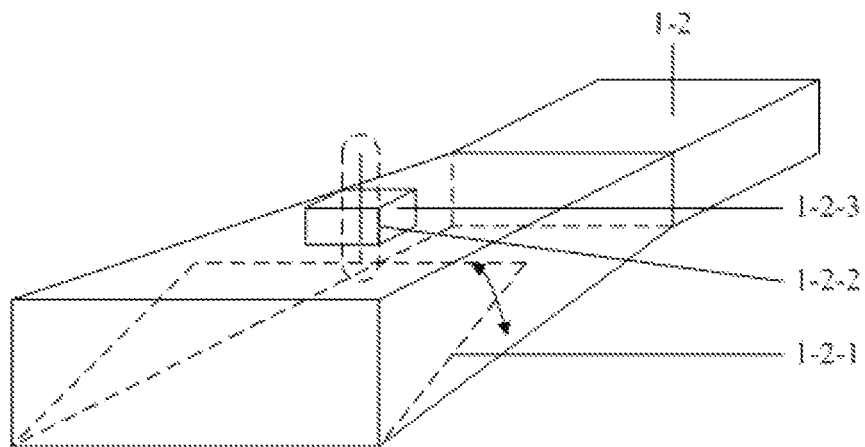
FIG. 4 is the schematic view of the side air outlet, baffle, pull rope and the fixed end of the pull rope.
Figure 5:
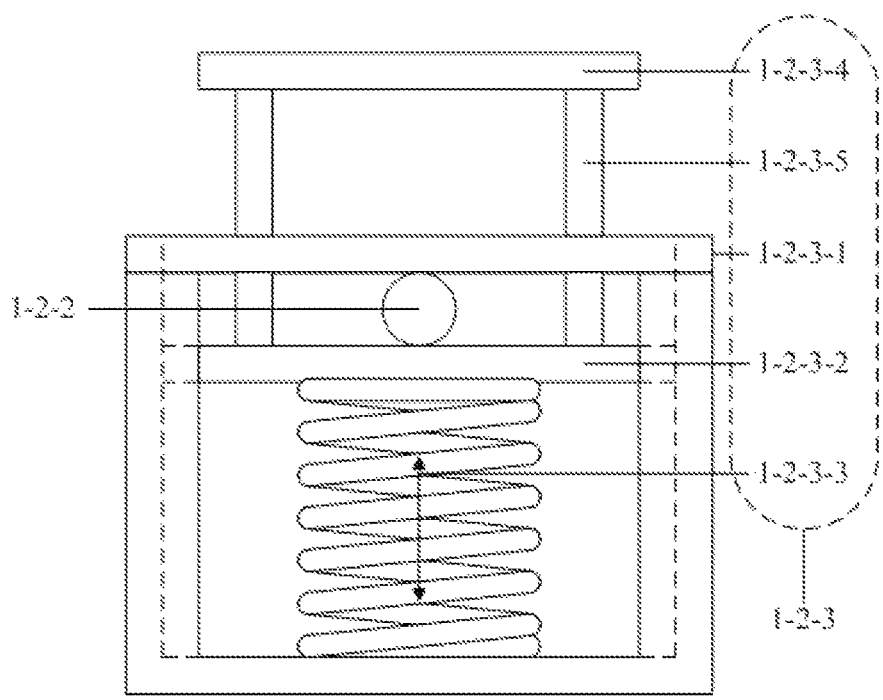
FIG. 5 is the schematic view of the fixed end of the pull rope.

The probe card for testing power devices under high-temperature and high voltage, wherein the cross-sectional area of the side air outlet 1-2 is gradually increased in the direction of constant temperature air flow, and the outer end of the side air outlet 1-2 is a rectangle with a width greater than the height; under the outer end of the side air outlet 1-2, the rotating shaft is connected with a baffle 1-2-1, and the edge of the other side of the baffle 1-2-1 is equipped with a pull rope 1-2-2 and the pull rope 1-2-2 passes through the upper part of the side air outlet 1-2, and the upper part of the side air outlet 1-2 is also provided with a fixed end of the pull rope 1-2-3. And the fixed end of the pull rope 1-2-3 comprises a frame 1-2-34, a fixed plate 1-2-3-2 arranged in the frame 1-2-3-1 and capable of moving up and down along the frame 1-2-3-1, a pressure spring 1-2-3-3 located below the fixed plate 1-2-3-2 and above the bottom of the frame 1-2-3-1, and a switch 1-2-3-4 located above the frame 1-2-3-1, and the switch 1-2-3-4 is connected to the fixed plate 1-2-3-2 through a bracket 1-2-3-5 passing through the frame 1-2-3-1. And the pull rope 1-2-2 passes through the frame 1-2-3-1 from the top of the fixed plate 1-2-3-2, and squeezed between the fixed plate 1-2-3-2 and the frame 1-2-3-1 under the action of the pressure spring 1-2-3-3. When the adjustment is needed, press the switch 1-2-3-4 to make the fixed plate 1-2-3-2 move downward to adjust the pull rope 1-2-2 and release the switch 1-2-3-4 after the position is adjusted;

The schematic view of the side air outlet 1-2, baffle 1-2-1, pull rope 1-2-2 and the fixed end of the pull rope 1-2-3 is shown in FIG. 4; the schematic view of the fixed end of the pull rope 1-2-3 is shown in FIG. 5.

Embodiment 3

The following is a specific embodiment of a probe card for testing power devices under high-temperature and high voltage.

Figure 6:
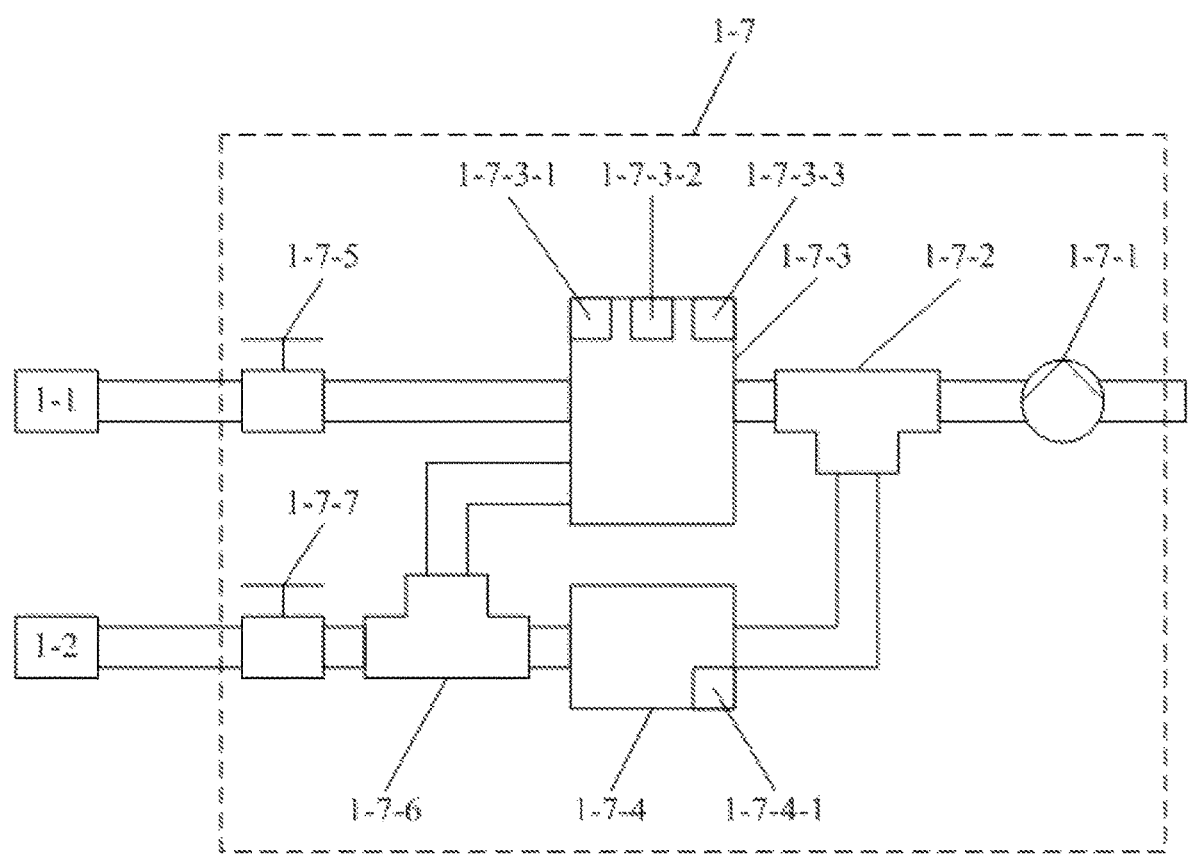
FIG. 6 is the schematic view of the dual air inlet device.

The probe card for testing power devices under high-temperature and high voltage of the embodiment further defines that the air inlet system 1 also comprises a dual air inlet device 1-7 on the basis of the specific embodiment 1, and according to the air flow direction, the dual air inlet device 1-7 comprises an air pump 1-7-1, a first three-way valve 1-7-2, a high-temperature and high-pressure tank 1-7-3 connecting the first outlet of the first three-way valve 1-7-2, and a normal temperature and high-pressure tank 1-7-4 connecting the second outlet of the first three-way valve 1-7-2. The high-temperature and high-pressure tank 1-7-3 is equipped with a resistance wire 1-7-3-1, a temperature sensor 1-7-3-2 and a first manometer 1-7-3-3 and the normal temperature and high-pressure tank 1-7-4 is equipped with a second manometer 1-7-4-1. The high-temperature and high-pressure tank 1-7-3 has two outlets, and the first outlet is connected to a lower air outlet 1-1 through the first valve 1-7-5, and the second outlet is connected to a second three-way valve 1-7-6, and the second three-way valve 1-7-6 is also connected to the outlet of the normal temperature and high-pressure tank 1-7-4 and the second valve 1-7-7 respectively, and the second valve 1-7-7 is connected to the side air outlet 1-2;

The schematic view of the dual air inlet device 1-7 is shown in FIG. 6.

Embodiment 4

The following is a specific embodiment of a probe card for testing power devices under high-temperature and high voltage.

On the basis of the specific embodiment 1, embodiment 2 or embodiment 3, the probe card for testing power devices under high-temperature and high voltage of the embodiment further defines that the thickness of the edge of the guide plate 4 is greater than the thickness of the central area, which is realized by the following technical features: the air bags 4-2 are arranged around the lower part of the guide plate 4.

Embodiment 5

The following is a specific embodiment of the probe card having a side air outlet.

A probe card has a side air outlet, wherein the cross-sectional area of the side air outlet 1-2 is gradually increased in the direction of constant temperature air flow, and the outer end of the side air outlet 1-2 is a rectangle with a width greater than the height; under the outer end of the side air outlet 1-2, the rotating shaft is connected with a baffle 1-2-1, and the edge of the other side of the baffle 1-2-1 is equipped with a pull rope 1-2-2 and the pull rope 1-2-2 passes through the upper part of the side air outlet 1-2, and the upper part of the side air outlet 1-2 is also provided with a fixed end of the pull rope 1-2-3. And the fixed end of the pull rope 1-2-3 comprises a frame 1-2-3-1, a fixed plate 1-2-3-2 arranged in the frame 1-2-3-1 and capable of moving up and down along the frame 1-2-3-1, a pressure spring 1-2-3-3 located below the fixed plate 1-2-3-2 and above the bottom of the frame 1-2-3-1, and a switch 1-2-3-4 located above the frame 1-2-3-1, and the switch 1-2-3-4 is connected to the fixed plate 1-2-3-2 through a bracket 1-2-3-5 passing through the frame 1-2-3-1. And the pull rope 1-2-2 passes through the frame 1-2-3-1 from the top of the fixed plate 1-2-3-2, and squeezed between the fixed plate 1-2-3-2 and the frame 1-2-3-1 under the action of the pressure spring 1-2-3-3. When the adjustment is needed, press the switch 1-2-3-4 to make the fixed plate 1-2-3-2 move downward to adjust the pull rope 1-2-2 and release the switch 1-2-3-4 after the position is adjusted;

The schematic view of the side air outlet 1-2, baffle 1-2-1, pull rope 1-2-2 and the fixed end of the pull rope 1-2-3 is shown in FIG. 4; the schematic view of the fixed end of the pull rope 1-2-3 is shown in FIG. 5.

Embodiment 6

The following is a specific embodiment of the probe card having a dual air inlet device.

A probe card of the embodiment has a dual air inlet device, and according to the air flow direction, it comprises an air pump 1-7-1, a first three-way valve 1-7-2, a high-temperature and high-pressure tank 1-7-3 connecting the first outlet of the first three-way valve 1-7-2, and a normal temperature and high-pressure tank 1-7-4 connecting the second outlet of the first three-way valve 1-7-2. The high-temperature and high-pressure tank 1-7-3 is equipped with a resistance wire 1-7-3-1, a temperature sensor 1-7-3-2 and a first manometer 1-7-3-3 and the normal temperature and high-pressure tank 1-7-4 is equipped with a second manometer 1-7-4-1. The high-temperature and high-pressure tank 1-7-3 has two outlets, and the first outlet is connected to a lower air outlet 1-1 through the first valve 1-7-5, and the second outlet is connected to a second three-way valve 1-7-6, and the second three-way valve 1-7-6 is also connected to the outlet of the normal temperature and high-pressure tank 1-7-4 and the second valve 1-7-7 respectively, and the second valve 1-7-7 is connected to the side air outlet 1-2;

The schematic view of the dual air inlet device 1-7 is shown in FIG. 6.

Embodiment 7

The following is a specific embodiment of a magnetic pressure relief structure for the probe card used for testing power devices.

For a magnetic pressure relief structure for the probe card used for testing power devices, the air inlet system 1 also comprises a pressure-relief hole 1-3, and the pressure-relief hole 1-3 is tapped with threads on the inner wall, and it's screwed with an adjusting part 1-5, and the adjusting part 1-5 includes a contact end 1-5-1 with a T-shaped section and a through-hole in the middle, an annular magnet 1-5-2 and an fixed end of the upper magnet 1-5-3, and the wide side wall of the contact end 1-5-1 is sleeved with threads for screwing on the inner wall of the pressure-relief hole 1-3, the narrow part is provided with an annular magnet 1-5-2, and the narrow side wall is sleeved with threads, and the inner wall of the fixed end of the upper magnet 1-5-3 is tapped with threads for screwing on the narrow side wall of the contact end 1-5-1, and the bottom of the wide part of the contact end 1-5-1 and the upper part of the fixed end of the upper magnet 1-5-3 fix the annular magnet 1-5-2; the pressure-relief hole 1-3 is also screwed with a valve part 1-4-1 on the inner wall, and the valve part 1-4-1 comprises a connector 1-4-1 with an inverted T-shaped section and a stepped through-hole, which is narrow at the top and wide at the bottom, and the narrow side wall of the connector 1-4-1 is sleeved with threads for screwing on the inner wall of the pressure-relief hole 1-3, and a circular magnet 1-4-2 is placed at the wide part of the stepped through-hole, and the circular magnet 1-4-2 is stuck with a sealing gasket 1-4-3 on the top and equipped with a notch on the side wall and a notch at the bottom, and the notch on the side wall is connected with the notch at the bottom, and the wide inner wall of the stepped through-hole is tapped with threads, and is screwed with a shielding ring 1-4-4 with a through-hole in the middle, and the circular magnet 1-4-2 can move up and down above the shielding ring 1-4-4 under the attraction of the annular magnet 1-5-2 and the push of the compressed air;

The connection relationship between pressure relief hole 1-3, valve part 1-4 and adjusting part 1-5 is shown in FIG. 2 and FIG. 3, where FIG. 2 is the schematic view of the position relationship between the relevant components when the pressure relief hole is not working and FIG. 3 is the schematic view of the position relationship between the relevant components when the pressure relief hole is working.

Embodiment 8

The following is a specific embodiment of the installation method of a magnetic pressure relief structure for the probe card used for testing power devices.

The installation method of a magnetic pressure relief structure for the probe card used for testing power devices includes the following steps:

Step a: Invert the adjusting part 1-5, put the annular magnet 1-5-2 on the contact end 1-5-1, and screw the fixed end of magnet 1-5-3 to fix the annular magnet 1-5-2;

Step b: Place the adjusting part 1-5 upright, and screw the contact end 1-5-1 of the adjusting part 1-5 into the pressure relief hole 1-3;

Step c: Invert the valve part 1-4, and put circular magnet 1-4-2 with sealing gasket 1-4-3 on the bottom into the stepped through-hole of valve part 1-4;

Step d: Install the shielding ring 1-4-4 in the stepped through-hole of valve part 1-4;

Step e: Place the valve part 1-4 upright, and screw the connector 1-4-1 of the valve part 1-4 into the pressure relief hole 1-3.

Embodiment 9

The following is a specific embodiment of the calibration method of a magnetic pressure relief structure for the probe card used for testing power devices.

The calibration method of a magnetic pressure relief structure for the probe card used for testing power devices includes the following steps:

Step a: Calibrate the relationship between magnetic force and distance between annular magnet 1-5-2 and circular magnet 1-4-2;

Step b: Set the pressure threshold value of the high-temperature and high-pressure gas;

Step c: Measure the mass sum of circular magnet 1-4-2 and sealing gasket 1-4-3;

Wherein Step a, Step b and Step c can be carried out in any order or synchronously;

Step d: Multiply the threshold value of the compressed air pressure by the cross-sectional area of the upper through-hole of the stepped through-hole of the connector 1-4-1, plus the mass sum of the circular magnet 1-4-2 and the sealing gasket 1-4-3 and multiply by the gravitational acceleration;

Step e: Make the magnetic force equal to the result calculated in Step d;

Step f. According to the relationship between the magnetic force and the distance calibrated in Step a, and according to the calculation results obtained in Step e, the distance between the annular magnet 1-5-2 and the circular magnet 1-4-2 is obtained;

Step g: Invert the adjusting part 1-5, put the annular magnet 1-5-2 on the contact end 1-5-1, and screw the fixed end of magnet 1-5-3 to fix the annular magnet 1-5-2;

Step h. Put the adjusting part 1-5 upright, and screw the contact end 1-5-1 of the adjusting part 1-5 into the pressure relief hole 1-3. The specific position is as follows: The distance from connector 1-4-1 to the lower end face of pressure relief hole 1-3 is the distance between annular magnet 1-5-2 and circular magnet 1-4-2 in Step f minus the thickness of the sealing gasket 1-4-3, minus the distance from the lower end face of pressure relief hole 1-3 to the step position of connector 1-4-1, plus the thickness of annular magnet 1-5-2, plus the distance from the upper end face of annular magnet 1-5-2 to the upper end face of contact end 1-5-1.

The invention claimed is:

1. A probe card for testing power devices under high temperature and high voltage, wherein the probe card is sequentially provided with an air inlet system, a PCB board, an switching layer, a guide plate and a probe from top to bottom; the bottom of the air inlet system is provided with a plurality of lower air outlets and side air outlets, the PCB board is provided with a first through-hole with the same position, shape and quantity as the lower air outlet, the switching layer is provided with a second through-hole with the same position, shape and quantity as the lower air outlet, the guide plate is provided with a third through-hole with the same position, shape and quantity as the lower air outlet; The lower air outlet, the first through-hole, the second through-hole and the third through-hole are coaxially arranged; The high-temperature and high-pressure gas ejected from the lower air outlet is blown between the guide plate and the tested wafer after successively passing through the first through-hole, the second through-hole and the third through-hole;

the air inlet system also comprises a pressure-relief hole, and the pressure-relief hole is tapped with threads on the inner wall, and it's screwed with an adjusting part, and the adjusting part includes a contact end with a T-shaped section and a through-hole in the middle, an annular magnet and an fixed end of the upper magnet, and the wide side wall of the contact end is sleeved with threads for screwing on the inner wall of the pressure-relief hole, the narrow part is provided with an annular magnet, and the narrow side wall is sleeved with threads, and the inner wall of the fixed end of the upper magnet is tapped with threads for screwing on the narrow side wall of the contact end, and the bottom of the wide part of the contact end and the upper part of the fixed end of the upper magnet fix the annular magnet; the pressure-relief hole is also screwed with a valve part on the inner wall, and the valve part comprises a connector with an inverted T-shaped section and a stepped through-hole, which is narrow at the top and wide at the bottom, and the narrow side wall of the connector is sleeved with threads for screwing on the inner wall of the pressure-relief hole, and a circular magnet is placed at the wide part of the stepped through-hole, and the circular magnet is stuck with a sealing gasket on the top and equipped with a notch on the side wall and a notch at the bottom, and the notch on the side wall is connected with the notch at the bottom, and the wide inner wall of the stepped through-hole is tapped with threads, and is screwed with a shielding ring with a through-hole in the middle, and the circular magnet can move up and down above the shielding ring under the attraction of the annular magnet and the push of the compressed air;

the function of each structure is as follows:

the thickness of the edge of the guide plate is greater than that of the central area;

the air inlet system is used to provide high-temperature and high-pressure gas and normal temperature and high-pressure gas, the lower air outlet is used to inject high-temperature and high-pressure gas to the probe, and the side air outlet is used to provide normal temperature and high-pressure gas to the PCB board;

the PCB board is used for connecting the testing machine and the signal wiring;

the switching layer is the medium between the probe and the PCB board, which is used to realize the signal distance conversion;

the guide plate is used for accommodating the probe;

the probe is used for connecting the tested wafer.

2. The probe card for testing power devices under high temperature and high voltage of claim 1, wherein the cross-sectional area of the side air outlet is gradually increased in the direction of constant temperature air flow, and the outer end of the side air outlet is a rectangle with a width greater than the height; Under the outer end of the side air outlet, the rotating shaft is connected with a baffle, and the edge of the other side of the baffle is equipped with a pull rope and the pull rope passes through the upper part of the side air outlet, and the upper part of the side air outlet is also provided with a fixed end of the pull rope, and the fixed end of the pull rope comprises a frame, a fixed plate arranged in the frame and capable of moving up and down along the frame, a pressure spring located below the fixed plate and above the bottom of the frame, and a switch located above the frame, and the switch is connected to the fixed plate through a bracket passing through the frame; And the pull rope passes through the frame from the top of the fixed plate, and squeezed between the fixed plate and the frame under the action of the pressure spring; When the adjustment is needed, press the switch to make the fixed plate move downward to adjust the pull rope and release the switch after the position is adjusted.

3. The probe card for testing power devices under high temperature and high voltage of claim 1, wherein the air inlet system also comprises a dual air inlet device, and according to the air flow direction, the dual air inlet device comprises an air pump, a first three-way valve, a high-temperature and high-pressure tank connecting the first outlet of the first three-way valve, and a normal temperature and high-pressure tank connecting the second outlet of the first three-way valve; The high-temperature and high-pressure tank is equipped with a resistance wire, a temperature sensor and a first manometer, and the normal temperature and high-pressure tank is equipped with a second manometer; The high-temperature and high-pressure tank has two outlets, and the first outlet is connected to a lower air outlet through the first valve, and the second outlet is connected to a second three-way valve, and the second three-way valve is also connected to the outlet of the normal temperature and high-pressure tank and the second valve respectively, and the second valve is connected to the side air outlet.

4. The probe card for testing power devices under high temperature and high voltage of claim 1, wherein the thickness of the edge of the guide plate is greater than the thickness of the central area, which is realized by the following technical features: the air bags are arranged around the lower part of the guide plate.

\* \* \* \* \*